United States Patent [19]

Reeber et al.

[11] Patent Number: 4,956,000
[45] Date of Patent: Sep. 11, 1990

[54] GRADIENT LENS FABRICATION

[76] Inventors: Robert R. Reeber, Rte. 7, Box 254A; Wei-Kan Chu, 6 Whisper La., both of Chapel Hill, N.C. 27514; Salah M. Bedair, 1221 Briar Patch, Raleigh, N.C. 27615

[21] Appl. No.: 374,111

[22] Filed: Jun. 28, 1989

[51] Int. Cl.$^5$ .................... C03B 19/00; C23C 19/04
[52] U.S. Cl. ........................ 65/18.1; 65/18.2; 65/37; 65/60.2; 65/3.12; 350/413; 350/417; 427/166; 427/282; 264/21
[58] Field of Search ............. 65/18.1, 18.2, 37, 60.1, 65/60.5, 60.51, 60.52, 60.2; 118/504, 720; 427/282, 165, 166, 167, 162; 350/413, 417

[56] References Cited

U.S. PATENT DOCUMENTS

| | | | |
|---|---|---|---|
| 2,341,827 | 2/1944 | Sukumlyn | 118/220 |
| 2,391,595 | 12/1945 | Richards et al. | 118/720 |
| 2,408,529 | 10/1946 | Osterberg | 118/720 |
| 2,410,720 | 11/1946 | Dimmick | 118/720 |
| 2,853,402 | 9/1958 | Blois | 118/720 |
| 2,925,496 | 2/1960 | Zoubek | 118/720 |
| 4,101,302 | 7/1978 | Krohn et al. | 65/30 R |
| 4,230,396 | 10/1980 | Olshansky et al. | 350/96.31 |
| 4,310,340 | 1/1982 | Sarkar | 65/3.12 |
| 4,358,181 | 11/1982 | Gulati et al. | 350/96.31 |
| 4,359,267 | 11/1982 | Appel | 350/320 |
| 4,405,207 | 9/1983 | Kay | 350/320 |
| 4,406,517 | 9/1983 | Olshansky | 350/96.31 |
| 4,425,146 | 1/1984 | Izawa et al. | 65/18.2 |
| 4,455,964 | 6/1984 | Weber | 118/504 |
| 4,473,273 | 9/1984 | Hodge | 350/96.31 |
| 4,547,210 | 10/1985 | Schneider | 65/2 |
| 4,776,868 | 10/1988 | Trotter et al. | 65/37 |
| 4,814,056 | 3/1989 | Welty | 118/720 |

FOREIGN PATENT DOCUMENTS

| | | | |
|---|---|---|---|
| 0197505 | 12/1982 | Japan | 65/37 |
| 4015964 | 1/1986 | Japan | 118/720 |

OTHER PUBLICATIONS

IBM Technical Disclosure Bulletin, Lentz, vol. 5, No. 1, 6-1962, p. 21.
R. A. Laudise, The Growth of Single Crystals, copyright 1970, by Prentice-Hall, Chapter 6, pp. 225-256.
Goela et al., "Monolithic Material Fabrication by Chemical Vapour Deposition", Journal of Materials Science (1988), pp. 4331-4339.

Primary Examiner—Peter Kratz
Attorney, Agent, or Firm—Saul Elbaum; Guy M. Miller

[57] ABSTRACT

A method for fabricating a lens in which the lens composition is controlled by dynamic shaping and shadowing. A lens material is vaporized and directed to a substrate through an orifice which is rotating relative to the substrate about the lens axis and which has a non-uniform radial distribution. The lens material is condensed on the substrate to form a lens having a radially non-uniform but axially symmetrical distribution. Thereafter, the original orifice may be replaced by a complimentary orifice and another lens material vaporized and directed to the substrate through the replacement orifice which is also rotating relative to the substrate about the lens axis and which also has a non-uniform radial distribution. This second lens material condenses on the first condensed lens material to form a compound lens.

4 Claims, 3 Drawing Sheets

GRADIENT LENS FABRICATION

RIGHTS OF THE GOVERNMENT

The invention described herein may be manufactured, used or licensed by and for the United States Government for governmental purposes without the payment to us of any royalty thereon.

BACKGROUND OF THE INVENTION

1. Field of the Invention

The invention relates to a method and apparatus for fabricating gradient lenses.

2. Description of the Related Art, including Information disclosed under 37 CFR 1.97-1.99

Conventional lens manufacturing involves the grinding of a given material or group of multiple fibers into a desired concave or convex shape, or radially changing the index of refraction of the lens material by doping, differential heat treating, cladding, coating, or alloying in a radially non-uniform way.

U.S. Pat. No. 4,101,302, issued July 18, 1978 to Krohn et al, describes a method of achieving local variation in phototropic properties across the face of a glass lens which contains all the ingredients required to produce phototropic behavior, in which the lens is exposed to a locally variable temperature field in such manner that the temperature of one lens portion exceeds the strain point but not the softening point of the glass, while the temperature of another lens portion is below the strain point, thus causing the development of phototropic behavior in only the one lens portion.

U.S. Pat. No. 4,230,396, issued Oct. 28, 1980 to Olshansky et al, and U.S. Pat. No. 4,406,517, issued Sept. 27, 1983 to Olshansky describe methods of fabricating a gradient index optical filament having a core in which the concentration of dopants is varied as a function of the radial distance form the core center to produce a radially varying index of refraction.

U.S. Pat. No. 4,359,267, issued Nov. 16, 1982 and U.S. Pat. No. 4,405,207 issued Sept. 20, 1983 to Kay describe similar lens forming methods in which a plurality of gradient index fibers are assembled into a lens array of the desired shape, with final finishing being accomplished by grinding the array to its exact finished form.

U.S. Pat. No. 4,358,181, issued Nov. 9, 1982 to Gulati et al, describes a method of making a preform for a high numerical aperture gradient index optical waveguide in which the concentration of a first dopant, $GeO_2$ is changed radially as the preform is built up in order to produce the desired radial refractive index gradient. The concentration of a second dopant, $B_2O_3$, is changed radially to compensate for the radial change of thermal expansion coefficient caused by the varying $GeO_2$ concentration. The growth of the body is accomplished through a cladding process with the $B_2O_3$ added to the cladding layer to make the thermal expansion coefficient of the cladding equal to or greater than the composite thermal expansion coefficient of the core. The magnitude of the residual stress at the inner surface caused by thermal expansion gradients is reduced and premature cracking of the preform is eliminated.

U.S. Pat. No. 4,547,210, issued Oct. 15, 1985 to Schneider, describes a process for drawing gradient optical fibers from a preform that itself is constructed of different composition filaments or tapes that are heated under specific conditions involving oxidizing atmospheres and chlorine gas.

U.S. Pat. No. 4,425,146, issued Jan. 10, 1984 to Izawa et al, describes a method of making a glass caveguide for an optical circuit in which halides of Si and Ti, B, P, or Ge and oxygen or steam are introduced into a reaction vessel and heated in a vapor phase to form fine glass particles by oxidation or hydrolysis. The fine glass particles are depositied on a substrate. They are then heated and vitrified into a transparent glass layer which is etched to form a core having a desired pattern by a reactive sputter etching process using freon gas. The core is coated by a clad. In the waveguide thus formed, the cross-sectional configuration and dimensions of the core layer and the refractive index difference are precisely controlled. An expansion coefficient transient layer is provided between the substate and the core layer to prevent a crack in the waveguide.

U.S. Pat. No. 4,473,273, issued Sept. 25, 1984 to Hodge, describes a method of forming a high bandwidth optical fiber in which the refractive index profile of the fiber is modified by rotating the fiber while drawing the first fiber from a preform. This method involves no deposition process.

U.S. Pat. No. 4,310,340, issued Jan. 12, 1982 to Sarkar, describes a method of making optical fiber waveguides in which a glass optical waveguide preform is prepared by chemical reaction of vapor ingredients in a bait tube. As the reactants flow through the bait tube, a hot zone traverses the tube to cause the deposition of soot in a section of the tube just downstream of the hot zone. An axially disposed tubular burner, which is located just upstream from the hot zone, is mechanically coupled to the burner which generates the hot zone. The burner generates as axial water-free flame that extends through the hot zone. The flame creates a mandrel which confines the flow or reactants to an annular channel adjacent the bait tube wall in the hot zone. The flame also extends downstream from the hot zone where it increases the thermal gradient between the axis and the wall of the bait tube, thereby enhancing the thermophoresis effect, whereby the deposition rate and efficiency are improved.

Chapter 6, pages 225-256, of the book entitled THE GROWTH OF SINGLE CRYSTALS, by R. A. Laudise, copyrighted 1970 by Prentice-Hall, Inc., Englewood Cliffs, N.J., provides a summary of many of the various techniques of vapor-solid growth. There is many publications describing in detail each of these techniques. For example, the CVD process is described in an article entitled "Monolithic material fabrication by chemical vapour deposition", by Goela and Taylor, Journal of Materials Science (1988), pages 4331-4339.

SUMMARY OF THE INVENTION

It is a primary object of the invention to provide a method and apparatus for fabricating a lens having a radially non-uniform but axially symmetrical distribution of lens material, in which the lens size and shape is determined by the selective direction and condensation of vaporized lens material onto a subtrate.

The lens material may be vaporized, i.e., brought to a gaseous state, by a known process such as CVD, MBE, MOCVD or other epitaxy growth process. The vaporized lens material is directed through the orifice of a lens shaping element towards an adjacent substrate upon which the vaporized lens material condenses and solidifies to form the desired lens. Relative to the substrate, the lens shaping element rotates about the lens axis. The orifice of the lens shaping element has a non-uniform radial distribution. The lens shape is determined by the orifice. For example, a star-shaped orifice will produce a convex lens, but a circular orifice having a star-shaped insert will produce a concave lens.

Actually, a circular orifice having a star-shaped insert includes five or six openings extending axially throught the lens shaping element, but all of these openings are described herein as a single orifice of the lens shaping element for purposes of clarity and simplification.

It is another object of the invention to provide a method and apparatus for fabricating a compound lens having a radially non-uniform but axially symmetrical distribution of two or more lens materials. This is accomplished by repeating the process described above, using a different lens material and a lens shaping element having a different shaped orifice. Complementary orifices can be utilized to fabricate a compound lens of uniform thickness. For example, a star-shaped orifice 20 can be used with a first lens material to form a convex lens and a complementary circular orifice with a star-shaped insert can be used with a second lens material to form a concave lens onto the convex lens, resulting in a compound lens of uniform thickness.

It is still another object of the invention to provide a method and apparatus for fabricating a gradient lens of two or more intermixed lens materials, having a radially non-uniform but axially symmetrical distribution of each lens material. This is accomplished by the same process described above for fabricating a compound lens, except the process is repeated many times, so that the end product is a gradient lens formed of many layers of two or more lens materials, each having a radially non-uniform but axially symmetrical distribution of lens material.

BRIEF DESCRIPTION OF THE DRAWINGS

The invention will be better understood, and further objects, features and advantages thereof will become more apparent from the following description of the preferred embodiments, taken in conjunction with the accompanying drawings in which.

DESCRIPTION OF PREFERRED EMBODIMENTS

Figure 1:
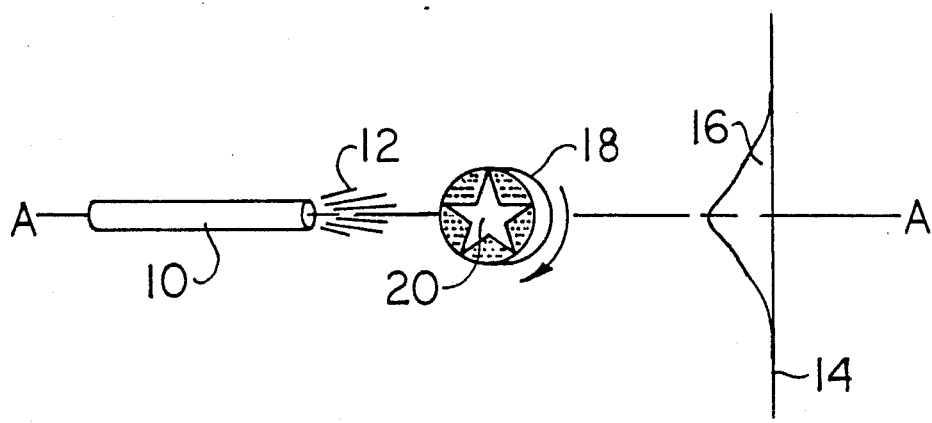
FIG. 1 is a simplified schematic drawing for showing how to form a convex lens, according to the invention.

The basic characteristic of the invention is composition control by dynamic shaping and shadowing. This is illustrated schematically in FIG. 1, which includes a source 10 for providing a lens material 12 in a fluid state and directing this fluid material 12 along an axis A—A towards a planar surface 14 where the fluid element 12 solidifies to form the desired lens 16. A lens shaping element 18, having a star-shaped opening 20, is disposed along the axis A—A between the source 10 and the planar surface 14. Either the lens shaping element 18 is rotated about the axis A—A relative to the planar surface 14 or the planar surface 14 is rotated about the axis A—A relative to the lens shaping element 18. The relative motion of the lens shaping element 18 and the planar surface 14 causes a laterally non-uniform but axially symmetrical distribution of the material 12 on the planar surface 14, to thus form a convex lens 16 on the planar surface 14.

Figure 2:
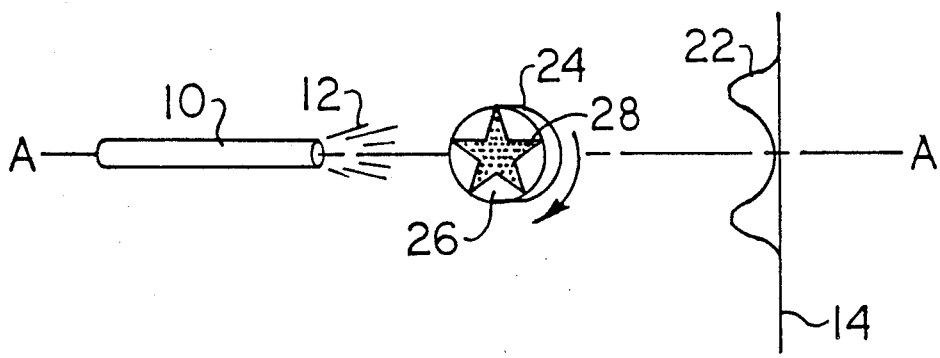
FIG. 2 is a simplified schematic drawing for showing how to form a concave lens, according to the invention.

If a concave lens 22 is desired, the lens shaping element 24 of FIG. 2, having a circular opening 26 extending symmetrically about the axis A—A and and a star-shaped insert 28, can be used in place of the lens shaping element 18.

Figure 3:
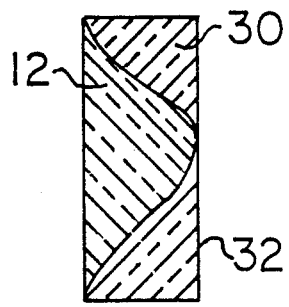
FIG.3 is a cross-section of a compound lens which is fabricated by using the lens shaping elements and lens materials of FIGS. 1 and 2 sequentially.

Also, two lens shaping elements with complementary shaped apertures, such as the elements 24 and 18, can be used sequentially to deposit two different lens materials 30 and 12 on the planar surface 14, to thus form a compound lens 32, as shown in FIG. 3.

The invention can be utilized in various known processes, such as MBE, MOCVD, or an epitaxy growth process to produce a radial distribution of dopant for making a lens or a wave guide. Materials which can be used for such a lens or wave guide include: $Ga_{1-x} In_x As$, generalized $III_{1-x} IV_x V$; $GaAs_{1-x} P_x$, generalized $III V_{1-x} V'_x$; $Ge_x Si_{1-x}$, generalized $VI'_x VI_{1-x}$; $Zn_x Cd_{1-x} Se$, generalized $II'_x II_{1-x} VI$ or $II VI'_x VI_{1-x}$; and any (III-V) VI or (II-VI)VI combination with composition variable x varying along the radial direction controlled by dynamic shaping.

The invention can be used for any material alteration by alloying for optical, electrical, and magnetic focusing which can be accomplished by cmposition variation.

The radial distribution of deposition can be controlled by tailoring the shape of the aperture through the lens shaping element.

Figure 4:
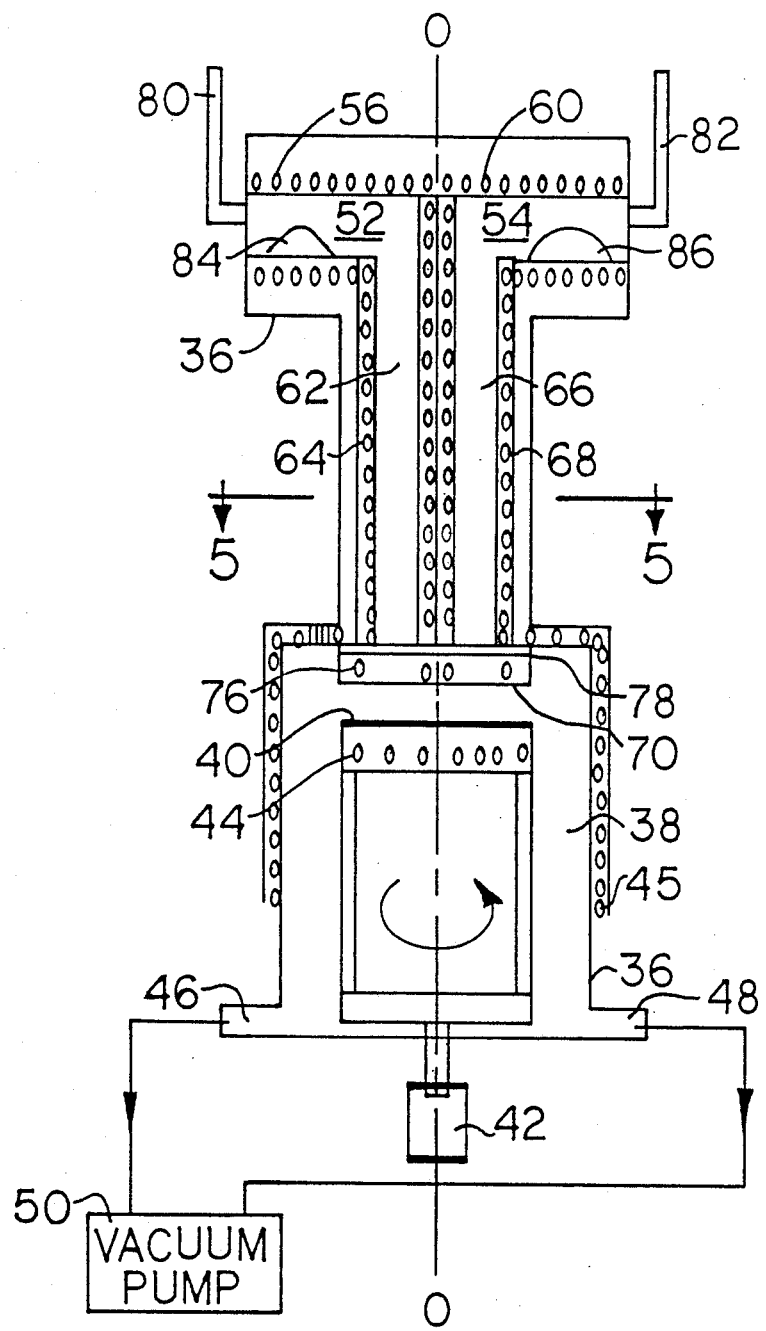
FIG. 4 is a simplified vertical cross-section view of an apparatus for forming a gradient toroidal lens of two intermixed lens materials each having a radially non-uniform but axially symmetrical distribution.

FIG. 4 shows an embodiment of the invention in which two different lens materials, ZnS and ZnSe are simultaneously vaporized, directed through respective apertures, and deposited on a substrate to form a toroidal lens 34 of $ZnS_x Se_{1-x}$ having a variable refractive index ranging from approximately 2.8 at the inner and outer lens diameters to 2.4 at the average diameter of the toroidal lens. This corresponds to a selenium-rich composition at the inner and outer diameters of the lens 34 and a sulphur-rich composition at the average lens diameter.

The embodiment of FIG. 4 includes a housing 36 which defines a substrate chamber 38 containing a high purity, polished, fused silica substrate 40 which is rotatable about a vertical axis 0—0 by an rotator 42, such as an electrical motor. The substrate-rotator assembly is laterally adjustable so that the vertical axis of rotation 0—0 can be accurately positioned. An electric substrate heater 44 is disposed beneath the substrate 40. The substrate chamber 38 includes an electric heating element 45 and has two evacuation openings 46, 48 which are connected to a vacuum pump 50.

A ZnS charge chamber 52 and a ZnSe charge chamber 54 are disposed in the upper portion of the housing 36. The ZnS charge chamber 52 includes an electric heater 56 for controlling the temperature within the chamber 52. Likewise, the ZnSe charge chamber 54 includes an electric heater 60 for controlling the temperature within the chamber 54. The ZnS charge chamber 52 is connected with the substrate chamber 38 by a fused silica transport tube 62 which is disposed within an electric heating coil 64 for controlling the temperature within the tube 62. In like manner, the ZnSe charge chamber 54 is connected with the substrate chamber 38 by a fused silica transport tube 66 which is disposed within an electric heating coil 68.

Figure 5:
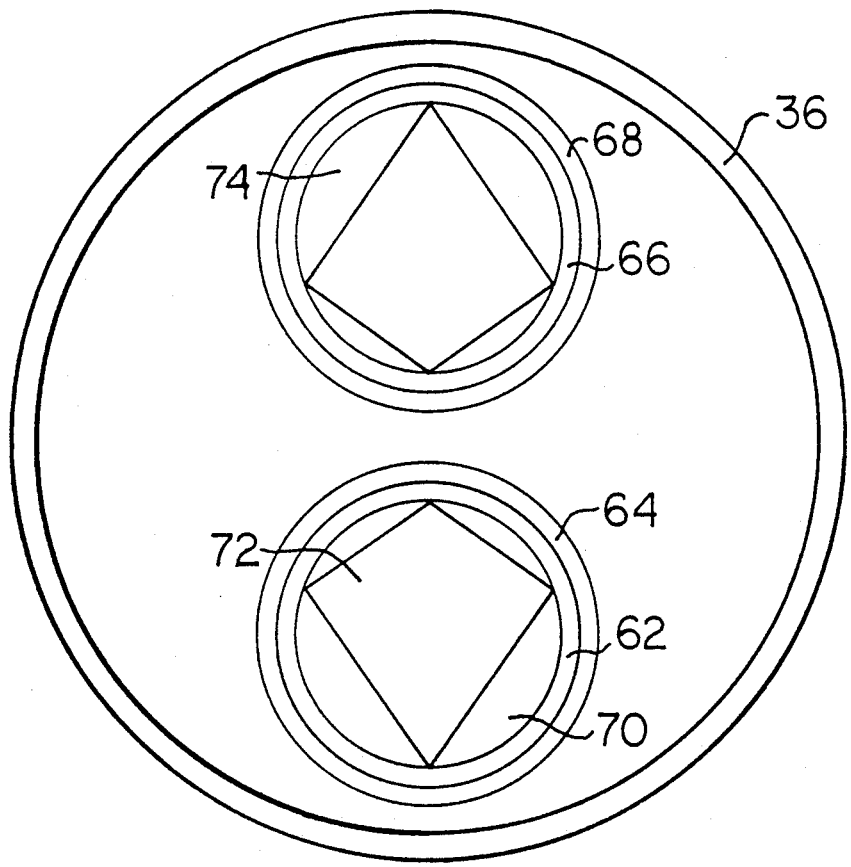
FIG. 5 is a horizontal cross-section view of the apparatus of FIG. 4, takent along the line 5—5 of FIG. 4.

The lower ends of the transport tubes 62, 66 is covered by a lens shaping element 70, which includes a set of complementary orifices 72, 74, respectively disposed between the transport tubes 62, 66 and the substrate 40, as shown in FIG. 5. The lens shaping element 70 also includes a heating element 76 and a rotatable valve plate 78 having openings therethrough to allow either or both transport tubes 62, 66 to be opened or closed.

The substrate-rotator assembly is adjusted so that its vertical axis of rotation 0—0 is aligned with and equidistant from the centerlines of the two transport tubes 62, 66.

The charge chamber 52, 54 also include respective fused silica entrance tubes 80, 82 which can either be sealed or connected to an inert gas supply.

During the lens manufacturing process, pre-sintered luminescent grade ZnS and ZnSe charges 84, 86 are introduced into the charge chambers 52, 54, respectively, and the charge chambers 52, 54, transport tubes 62, 66. and substrate chamber 38 are evacuated by the vacuum pump 50. These chambers and tubes are then backfilled with high purity argon gas at low pressure (e.g., 0.14 atm.) supplied through the entrances tubes 80, 82. The charge chambers 52, 54 are maintained at or above the sublimation temperature of their respective charges by the heaters 56, 60. The transport tubes 62, 66 are maintained at a temperature above the condensation temperature or the gaseous charge, ZnS or ZnSe, passing therethrough by the heating coils 64, 68. The lens shaping element 70 is maintained at a temperature higher than the lowest condensation temperature of the two gaseous charges to prevent clogging of the orifices 72, 74. The substrate 40 is maintained at a temperature below the condensation temperatures of both ZnS and ZnSe so that both gaseous charges passing through the orifices 72, 74 will condense on the substrate 40 to form the desired toriodal lens.

During the vapor deposition process, the substrate 40 is rotated very slowly (4 to 6 rotations per hour) to improve the overall crystal homogeneity, and the substrate is also lowered at a slow rate (e.g., 0.4 mm per hour) to allow the growth interface to remain at the same position and growth temperature.

As best shown in FIG. 5, the ZnSe gaseous charge flowing through the orifice 74 supplies essentially all of the material being condensed and deposited at the inner and outer diameters of the toroidal lens forming on the substrate 40, and the ZnS gaseous charge flowing through the orifice 72 supplies essentially all of the material being condensed and deposited at the mid-diameter of the toroidal lens, with the relative proportions of ZnS and ZnSe gradually changing from the lens mid-diameter to both the inner and outer lens diameters.

There are many obvious modifications, variations and additions to this apparatus and procedure. For example, the shape of the orifices 72, 74 could be changed so that the thickness of the toroidal lens varies from a minimum at the outer periphery of the lens to a maximum at the inner periphery, with the lens having a selenium-rich composition at the outer periphery and a sulphur-rich composition at the inner periphery. Also, the apparatus could include a third assembly of a charge chamber, transport tube and lens shaping element adjacent the two other assemblies shown in FIG. 5. In such an arrangement, the substrate-rotator assembly could be adjusted so that its axis of rotation 0—0 coincides with the centerline of the third transport tube and a third lens material could be vaporized and condensed in the center space of the toroidal lens to thus form a solid gradient lens.

It may also be noted that growth of these lenses may occur at lower temperatures in a CVD process, in which either elemental zinc and $H_2S$ or $H_2Se$ (for ZnS and ZnSe respectively) are used. The carrier/reactant gas is diluted appropiately with $H_2$ gas. Correspondingly chemical transport with a halide such as iodine may be utilized.

The apparatus of FIG. 5 may also be used to fabricate a compound lens such as shown in FIG. 3 by using appropiate orifices in the lens shaping element 70 and by varying the fabrication procedure. For example, the orifice 72 could be replaced by the star-shaped orifice 20 and the orifice 74 could be replaced by the complementary circular orifice 26 having a star-shaped insert 28 to fabricate a compound lens similar to that of FIG. 3, having a sulphur-rich composition at the lens center and a selenium-rich composition at the lens periphery.

During the first part of the fabrication process, the substrate-rotator assembly is adjusted so that the axis of rotation 0—0 coincides with the centerline of the ZnS transport tube 62 and the valve plate 78 is positioned so that the ZnS transport tube 62 is open and the ZnSe transport tube 66 is closed. After a ZnS convex lens has formed on the substrate 40, the valve plate 78 is rotated to close both tubes 62, 66 and the substrate-rotator assembly shifted laterally so that the axis of rotation 0—0 coincides with the centerline of the ZnSe transport tube 66. Then the valve plate 78 is adjusted to open the ZnSe transport tube 66 and allow a ZnSe concave lens to form on the ZnS convex lens.

It would be obvious to one skilled in the art that the avbove-described apparatus and process for fabricating a gradient lens vcould be automated such that the substrate-rotator assembly would be shifted between two preset positions in coordination with the automatic operation of the valve plate 78 many times during the lens fabrication process, so that the end product would be a gradient lens formed of many alternate layers of ZnS and ZnSe, with the distribution of both ZnS and ZnSe being radially non-uniform but axially symmetrical.

Also, lens fabricated according to the invention may be ground and polished as any other lens to achieve a desired final shape or characteristics.

Since there are many variations, additions and changes to the invention which would be obvious to one skilled in the art, it is intended that the scope of the invention be limited only by the appended claims.

What is claimed and desired to be secured by Letters Patent of the United States is:

1. A method of making a lens having an axis and having a radially non-uniform but axially symmetrical distribution of lens material, which comprises the steps of:

positioning a first lens shaping element and a substrate upon which the lens is to be formed so that the first lens shaping element is adjacent the substrate, the first lens shaping element defining an orifice which extends in an axial direction through the first lens shaping element and which has a non-uniform radial distribution about the lens axis;

providing a relative rotation between the first lens shaping element and the substrate about the lens axis;

vaporizing a first lens material;

directing the vaporized first lens material towards the substrate through the orifice of the first lens shaping element; and condensing the vaporized first lens material at the substrate;

repositioning the first lens shaping element and the substrate to be spaced apart from one another;

positioning a second lens shaping element and the substrate upon which the first lens material has been condensed so that the second lens shaping element is adjacent the substrate, the second lens shaping element having an orifice which extends in an axial direction through the second lens shaping element and which has a non-uniform radial distribution about the lens axis;

providing a relative rotation between the second lens shaping element and the substrate about the lens axis;

vaporizing a second lens material;

directing the vaporized second lens material towards the substrate through the orifice of the second lens shaping element; and condensing the vaporized second lens material at the substrate onto the condensed first lens material, to thus form a compound lens.

2. A method making a lens, as described in claim 1, wherein the first lens shaping element is stationary and the step of providing a relative rotation comprises rotating the substrate about the lens axis.

3. A method of making a lens, as described in claim 1, wherein the substrate is stationary and the step of providing a relative rotation comprises rotating the first lens shaping element about the lens axis.

4. A method of making a lens, as described in claim 1, wherein the orifices of the first and second lens shaping elements are shaped such that, in the compound lens formed by this method, the thickness of one lens material increases along a lens radius from the lens axis to the lens periphery while the thickness of the other lens material decreases so that the compound lens has a substantially uniform thickness along the lens radius.

* * * * *